United States Patent
Liao

(10) Patent No.: US 8,212,340 B2
(45) Date of Patent: Jul. 3, 2012

(54) CHIP PACKAGE AND MANUFACTURING METHOD THEREOF

(75) Inventor: Kuo-Hsien Liao, Taichung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 301 days.

(21) Appl. No.: 12/501,636

(22) Filed: Jul. 13, 2009

(65) Prior Publication Data

US 2011/0006408 A1    Jan. 13, 2011

(51) Int. Cl.
H01L 23/552 (2006.01)
(52) U.S. Cl. .................. 257/660; 257/E23.114
(58) Field of Classification Search .............. 257/660, 257/E23.114
See application file for complete search history.

(56) References Cited

U.S. PATENT DOCUMENTS

| | | |
|---|---|---|
| 3,390,226 A | 6/1968 | Beyerlein |
| 4,569,786 A | 2/1986 | Deguchi |
| 4,717,948 A | 1/1988 | Sakai et al. |
| 4,814,205 A | 3/1989 | Arcilesi et al. |
| 4,821,007 A | 4/1989 | Fields et al. |
| 5,140,745 A | 8/1992 | McKenzie |
| 5,166,772 A | 11/1992 | Soldner et al. |
| 5,172,077 A | 12/1992 | Funada |
| 5,353,498 A | 10/1994 | Fillion et al. |
| 5,355,016 A | 10/1994 | Swirbel et al. |
| 5,557,142 A | 9/1996 | Gilmore et al. |
| 5,600,181 A | 2/1997 | Scott et al. |
| 5,639,989 A | 6/1997 | Higgins, III |
| 5,677,511 A | 10/1997 | Taylor et al. |
| 5,694,300 A | 12/1997 | Mattei et al. |
| 5,703,761 A * | 12/1997 | Heiss .................. 361/800 |
| 5,726,612 A | 3/1998 | Mandai |
| 5,729,437 A | 3/1998 | Hashimoto |
| 5,776,798 A | 7/1998 | Quan et al. |
| 5,847,930 A | 12/1998 | Kazle |
| 5,864,088 A | 1/1999 | Sato et al. |
| 5,886,876 A | 3/1999 | Yamaguchi |
| 5,895,229 A | 4/1999 | Carney et al. |
| 5,898,344 A | 4/1999 | Hayashi |
| 5,966,052 A | 10/1999 | Sakai |
| 5,977,626 A | 11/1999 | Wang et al. |
| 5,998,867 A | 12/1999 | Jensen et al. |
| 6,079,099 A | 6/2000 | Uchida et al. |
| 6,093,972 A | 7/2000 | Carney et al. |
| 6,150,193 A | 11/2000 | Glenn |
| 6,194,250 B1 | 2/2001 | Melton et al. |
| 6,225,694 B1 | 5/2001 | Terui |
| 6,255,143 B1 | 7/2001 | Briar |
| 6,261,680 B1 | 7/2001 | Denman |
| 6,369,335 B1 | 4/2002 | Wajima |
| 6,376,769 B1 | 4/2002 | Chung |
| 6,448,632 B1 | 9/2002 | Takiar et al. |
| 6,455,864 B1 | 9/2002 | Featherby et al. |

(Continued)

FOREIGN PATENT DOCUMENTS

CN        1442033 A    9/2003

(Continued)

*Primary Examiner* — Lex Malsawma

(74) *Attorney, Agent, or Firm* — Foley & Lardner LLP

(57) ABSTRACT

A chip package including a shielding layer conformally covering the underlying molding compound for is provided. The shielding layer can smoothly cover the molding compound and over the rounded or blunted, top edges of the molding compound, which provides better electromagnetic interferences shielding and better shielding performance.

20 Claims, 12 Drawing Sheets

U.S. PATENT DOCUMENTS

| | | |
|---|---|---|
| 6,472,598 B1 | 10/2002 | Glenn |
| 6,472,743 B2 | 10/2002 | Huang et al. |
| 6,479,903 B2 | 11/2002 | Briar |
| 6,492,194 B1 | 12/2002 | Bereau et al. |
| 6,521,978 B2 | 2/2003 | Fenk et al. |
| 6,566,596 B1 | 5/2003 | Askew |
| 6,586,822 B1 | 7/2003 | Vu et al. |
| 6,602,737 B2 | 8/2003 | Wu |
| 6,614,102 B1 | 9/2003 | Hoffman et al. |
| 6,635,953 B2 | 10/2003 | Wu |
| 6,686,649 B1 | 2/2004 | Mathews et al. |
| 6,695,985 B2 | 2/2004 | Igarashi et al. |
| 6,740,546 B2 | 5/2004 | Corisis et al. |
| 6,740,959 B2 | 5/2004 | Alcoe et al. |
| 6,757,181 B1 | 6/2004 | Villanueva |
| 6,781,231 B2 | 8/2004 | Minervini |
| 6,800,804 B2 | 10/2004 | Igarashi et al. |
| 6,838,776 B2 | 1/2005 | Leal et al. |
| 6,856,007 B2 | 2/2005 | Warner |
| 6,865,084 B2 | 3/2005 | Lin et al. |
| 6,867,480 B2 | 3/2005 | Legaspi, Jr. et al. |
| 6,881,896 B2 | 4/2005 | Ebihara |
| 6,900,383 B2 | 5/2005 | Babb et al. |
| 6,928,719 B2 | 8/2005 | Kim et al. |
| 6,962,869 B1 | 11/2005 | Bao et al. |
| 6,967,403 B2 | 11/2005 | Chuang et al. |
| 6,975,516 B2 | 12/2005 | Asahi et al. |
| 6,992,400 B2 | 1/2006 | Tikka et al. |
| 6,998,532 B2 | 2/2006 | Kawamoto et al. |
| 7,012,323 B2 | 3/2006 | Warner et al. |
| 7,030,469 B2 | 4/2006 | Mahadevan et al. |
| 7,045,385 B2 | 5/2006 | Kim et al. |
| 7,049,682 B1 | 5/2006 | Mathews et al. |
| 7,081,661 B2 | 7/2006 | Takehara et al. |
| 7,125,744 B2 | 10/2006 | Takehara et al. |
| 7,126,218 B1 | 10/2006 | Darveaux et al. |
| 7,161,252 B2 | 1/2007 | Tsuneoka et al. |
| 7,180,012 B2 | 2/2007 | Tsuneoka et al. |
| 7,183,498 B2 | 2/2007 | Ogura et al. |
| 7,186,928 B2 | 3/2007 | Kikuchi et al. |
| 7,187,060 B2 | 3/2007 | Usui |
| 7,294,587 B2 | 11/2007 | Asahi et al. |
| 7,327,015 B2 | 2/2008 | Yang et al. |
| 7,342,303 B1 | 3/2008 | Berry et al. |
| 7,372,151 B1 | 5/2008 | Fan et al. |
| 7,445,968 B2 | 11/2008 | Harrison et al. |
| 7,446,265 B2 | 11/2008 | Krohto et al. |
| 7,451,539 B2 | 11/2008 | Morris et al. |
| 7,478,474 B2 | 1/2009 | Koga |
| 7,488,903 B2 | 2/2009 | Kawagishi et al. |
| 7,566,955 B2 | 7/2009 | Warner |
| 7,576,415 B2 | 8/2009 | Cha et al. |
| 7,629,674 B1 | 12/2009 | Foster |
| 7,633,170 B2 | 12/2009 | Yang et al. |
| 7,633,765 B1 | 12/2009 | Scanlan et al. |
| 7,643,311 B2 | 1/2010 | Coffy |
| 7,656,047 B2 | 2/2010 | Yang et al. |
| 7,700,411 B2 | 4/2010 | Yang et al. |
| 7,741,151 B2 | 6/2010 | Amrine et al. |
| 7,745,910 B1 * | 6/2010 | Olson et al. ............ 257/659 |
| 7,772,046 B2 | 8/2010 | Pagaila et al. |
| 7,799,602 B2 * | 9/2010 | Pagaila et al. ............ 438/106 |
| 7,829,981 B2 | 11/2010 | Hsu |
| 2002/0053724 A1 | 5/2002 | Lai et al. |
| 2002/0093108 A1 | 7/2002 | Grigorov |
| 2004/0020673 A1 | 2/2004 | Mazurkiewicz |
| 2004/0063242 A1 | 4/2004 | Kamezos |
| 2004/0150097 A1 | 8/2004 | Gaynes et al. |
| 2004/0178500 A1 | 9/2004 | Usui |
| 2004/0231872 A1 | 11/2004 | Arnold et al. |
| 2004/0252475 A1 | 12/2004 | Tsuneoka et al. |
| 2005/0013082 A1 | 1/2005 | Kawamoto et al. |
| 2005/0029673 A1 | 2/2005 | Naka et al. |
| 2005/0039946 A1 | 2/2005 | Nakao |
| 2005/0045358 A1 | 3/2005 | Arnold |
| 2005/0046001 A1 | 3/2005 | Warner |
| 2005/0208702 A1 | 9/2005 | Kim |
| 2006/0145361 A1 | 7/2006 | Yang et al. |
| 2006/0148317 A1 | 7/2006 | Akaike et al. |
| 2006/0160261 A1 | 7/2006 | Sheats et al. |
| 2006/0266547 A1 | 11/2006 | Koga |
| 2006/0292753 A1 * | 12/2006 | Takahashi et al. ............ 438/127 |
| 2007/0030661 A1 | 2/2007 | Morris |
| 2007/0241437 A1 | 10/2007 | Kagaya et al. |
| 2008/0042301 A1 | 2/2008 | Yang et al. |
| 2008/0061407 A1 | 3/2008 | Yang et al. |
| 2008/0128890 A1 | 6/2008 | Choi et al. |
| 2008/0174013 A1 | 7/2008 | Yang et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0025211 A1 | 1/2009 | Hiner et al. |
| 2009/0027863 A1 | 1/2009 | Karnezos |
| 2009/0035895 A1 | 2/2009 | Lee et al. |
| 2009/0075428 A1 | 3/2009 | Tang et al. |
| 2009/0102003 A1 | 4/2009 | Vogt et al. |
| 2009/0102033 A1 | 4/2009 | Raben |
| 2009/0152688 A1 | 6/2009 | Do et al. |
| 2009/0194851 A1 | 8/2009 | Chiu et al. |
| 2009/0194852 A1 | 8/2009 | Chiu et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chien et al. |
| 2009/0230526 A1 | 9/2009 | Chen et al. |
| 2009/0236700 A1 | 9/2009 | Moriya |
| 2009/0256244 A1 | 10/2009 | Liao et al. |
| 2009/0261470 A1 | 10/2009 | Choi et al. |
| 2009/0294928 A1 | 12/2009 | Kim et al. |
| 2009/0302435 A1 * | 12/2009 | Pagaila et al. ............ 257/659 |
| 2009/0302446 A1 | 12/2009 | Lee et al. |
| 2010/0006330 A1 | 1/2010 | Fu et al. |
| 2010/0013064 A1 | 1/2010 | Hsu |
| 2010/0032815 A1 | 2/2010 | An et al. |
| 2010/0109132 A1 | 5/2010 | Ko et al. |
| 2010/0110656 A1 | 5/2010 | Ko et al. |
| 2010/0207257 A1 | 8/2010 | Lee |
| 2010/0207258 A1 | 8/2010 | Eun et al. |
| 2010/0207259 A1 | 8/2010 | Liao et al. |
| 2011/0115059 A1 | 5/2011 | Lee |
| 2011/0115060 A1 | 5/2011 | Chiu et al. |
| 2011/0115066 A1 | 5/2011 | Kim |
| 2011/0127654 A1 | 6/2011 | Weng et al. |

FOREIGN PATENT DOCUMENTS

| | | |
|---|---|---|
| CN | 1774804 A | 5/2006 |
| JP | 55044737 | 3/1980 |
| JP | 58122759 | 7/1983 |
| JP | 59051555 | 3/1984 |
| JP | 63262860 | 10/1988 |
| JP | 64037043 | 2/1989 |
| JP | 64064298 | 3/1989 |
| JP | 02078299 | 3/1990 |
| JP | 03023654 | 1/1991 |
| JP | 03171652 | 7/1991 |
| JP | 04147652 | 5/1992 |
| JP | 04206858 | 7/1992 |
| JP | 05129476 | 5/1993 |
| JP | 08288686 | 11/1996 |
| JP | 2003273571 | 9/2003 |
| WO | WO 2004060034 | 7/2004 |
| WO | WO 2006076613 | 7/2006 |

* cited by examiner

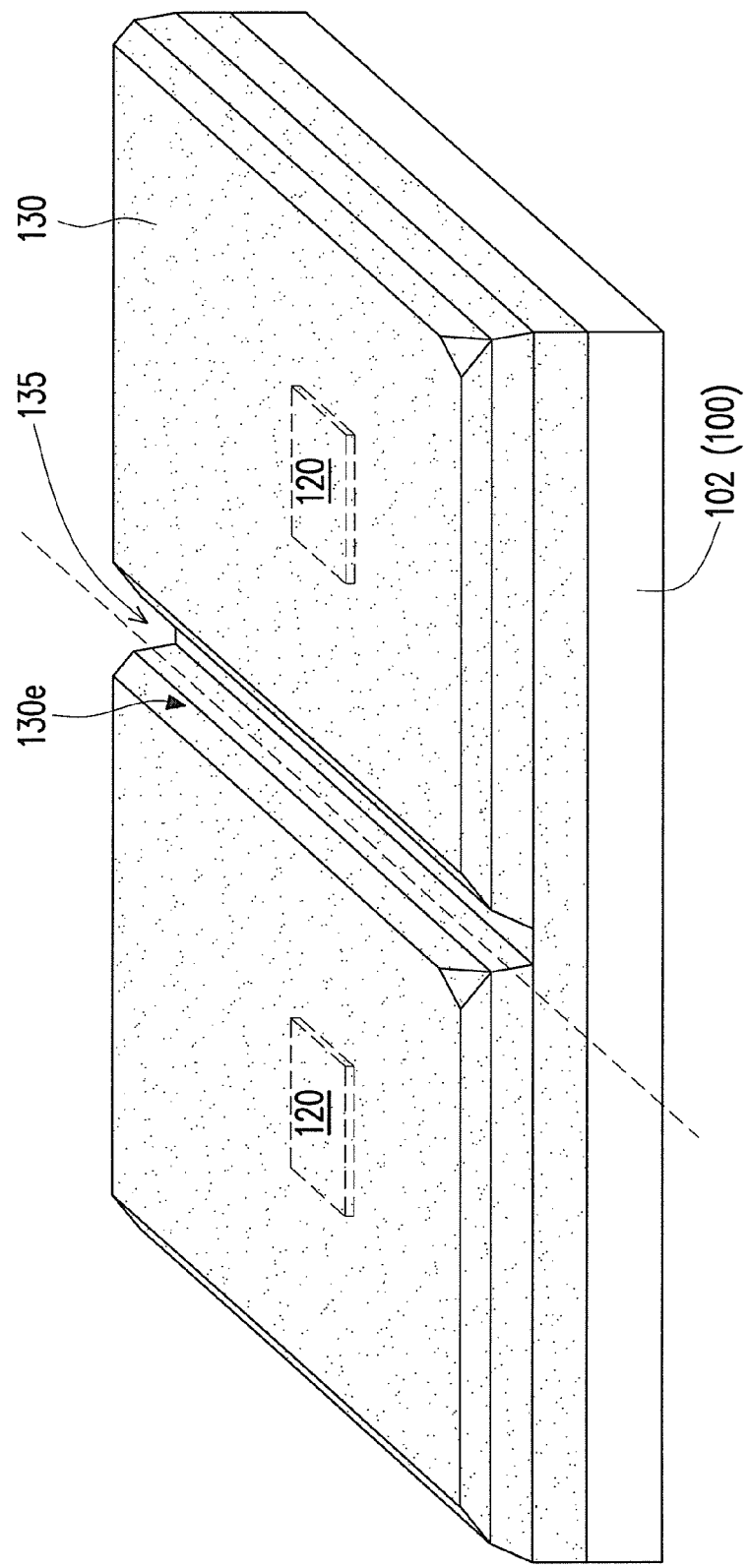
FIG. 1D"

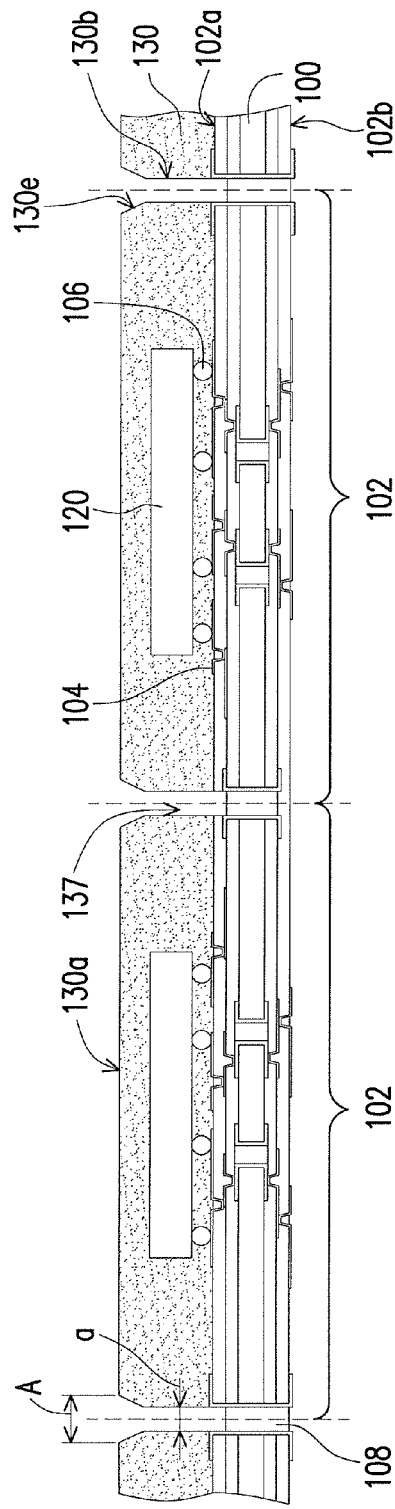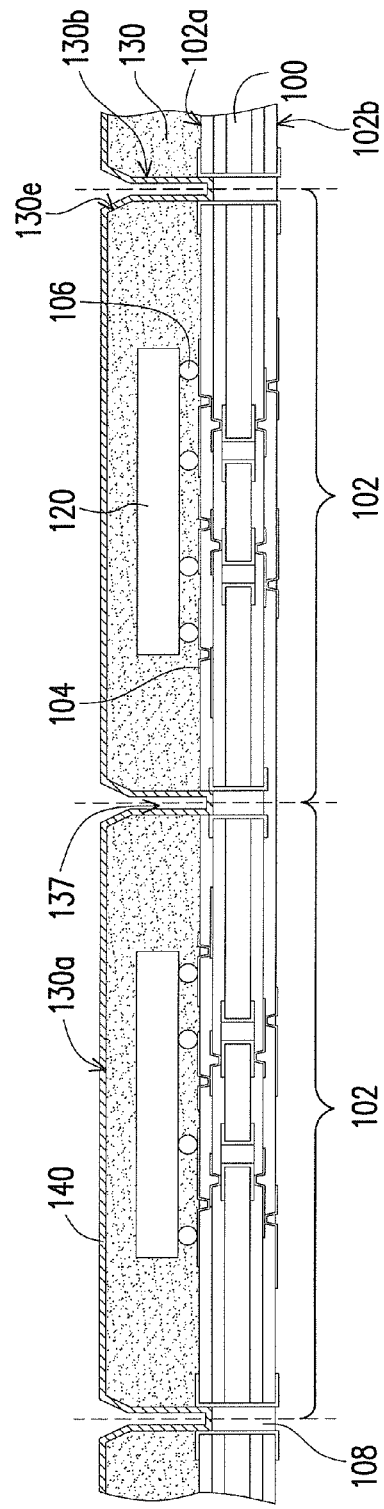

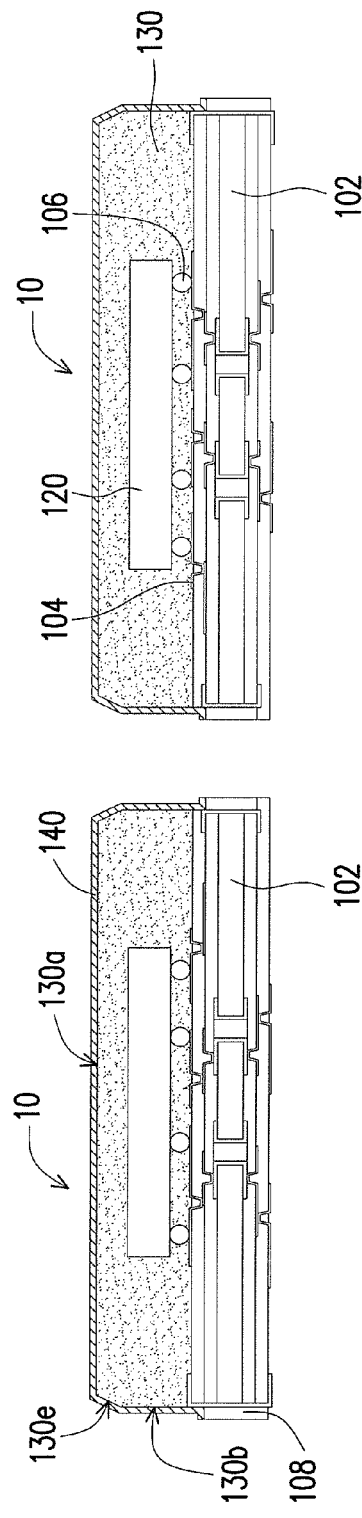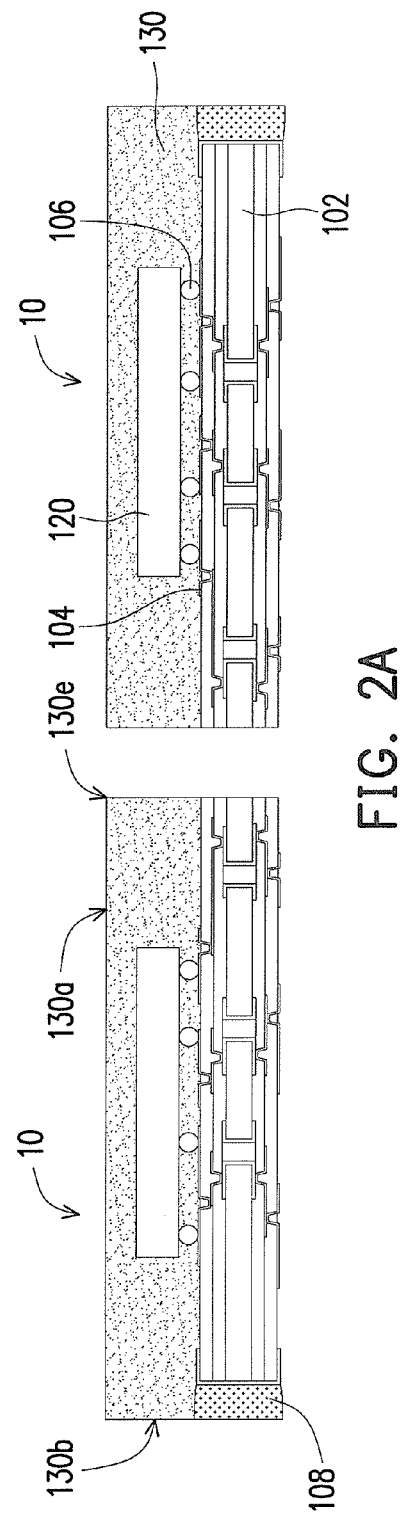
FIG. 1G
FIG. 2A

CHIP PACKAGE AND MANUFACTURING METHOD THEREOF

BACKGROUND OF THE INVENTION

1. Field of the Invention

The present invention relates to a semiconductor device, and more particularly to a chip package.

2. Description of Related Art

Electro-magnetic interference (EMI) is a serious and challenging problem for most electronic devices or systems. As EMI disturbances commonly interrupt, degrade or limit the effective performance of the electronic device or the whole circuit of the electronic system, it is necessary for the electronic devices or systems to have efficient EMI protection to ensure the effective and safe operation.

EMI protection is particularly important in small-sized, densely packaged or sensitive electronic applications operating at high frequencies. Conventionally, EMI shielding solutions typically involve the use of metal plates and/or conductive gaskets, which are later attached or affixed at higher manufacturing costs.

SUMMARY OF THE INVENTION

In view of the foregoing, the present invention provides a manufacturing method of a chip package, which offers better design flexibility with less effort.

The present invention is further directed to a chip package with enhanced effectiveness of EMI shielding.

The present invention provides a chip package including a substrate, at least a chip disposed on the substrate, a molding compound and a shielding layer conformally covering the molding compound. The top edges of the molding compound are blunt or rounded. The shielding layer conformally covers the top edges of the molding compound and a top surface and sidewalls of the molding compound, and the shielding layer is electrically connected to the semiconductor substrate.

The invention further provides a manufacturing method of a chip package. At least a chip is disposed on one of the substrate units of the matrix substrate, and the chip is electrically connected to the substrate unit. After forming a molding compound over the matrix substrate to encapsulate the chips, portions of the substrate units, a grinding process and a singulation process are performed to the molding compound. Later, a shielding layer is formed over the molding compound to conformally cover the molding compound of each chip packages.

According to one embodiment of the present invention, the grinding process can be performed before or after the singulation process. Also a half-cutting process may be further performed before or after the grinding process. The grinding process may comprise an oblique disc grinding process or a rounding grinding process.

According to one embodiment of the present invention, the shielding layer and the connectors are formed from a conductive material by a spraying process, a sputtering process or a plating process.

According to the embodiments of the present invention, the grinding process makes the top edges of the molding compound blunt or rounded, so that the later formed shielding layer can smoothly covers the top edges or corners of the molding compound of individual chip packages, without the crevices.

Herein, the crevices often occurring at the orthogonal corners or edges of the shielding layer can be avoided, and the shielding layer can uniformly cover the molding compound of the chip package and provide effective EMI shield of the chip package. According to the present invention, owing to the complete coverage of the shielding layer, the reliability of the package and the shielding efficacy can be improved.

In order to the make the aforementioned and other objects, features and advantages of the present invention comprehensible, several embodiments accompanied with figures are described in detail below.

BRIEF DESCRIPTION OF THE DRAWINGS

FIGS. 1A through 1G are schematic views showing a manufacturing method of the chip package according to one preferred embodiment of the present invention.

DESCRIPTION OF EMBODIMENTS

Figure 1A:
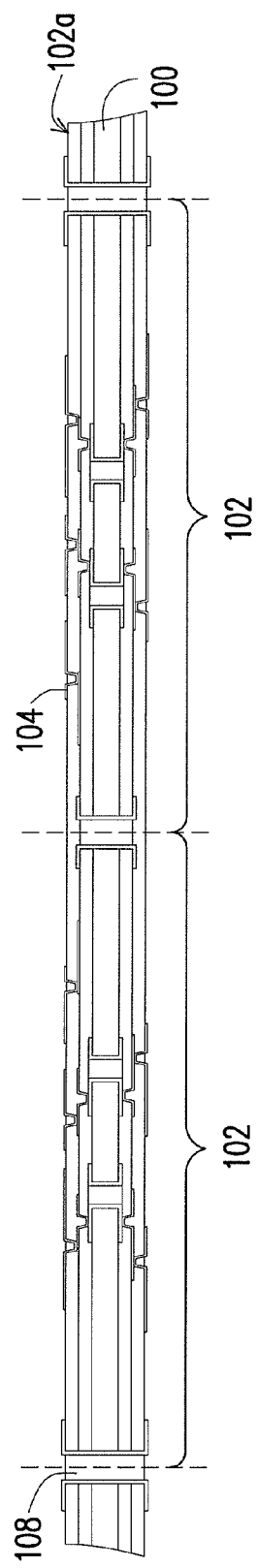

Reference will now be made in detail to the present preferred embodiments of the invention, examples of which are illustrated in the accompanying drawings. Wherever possible, the same reference numbers are used in the drawings and the description to refer to the same or like parts.

The manufacturing methods as described in the present invention can be used for fabricating various package structures and are more suitable for fabricating stacked type packages, multiple-chip packages, or high frequency device packages (including radio frequency device packages).

Figure 1B:
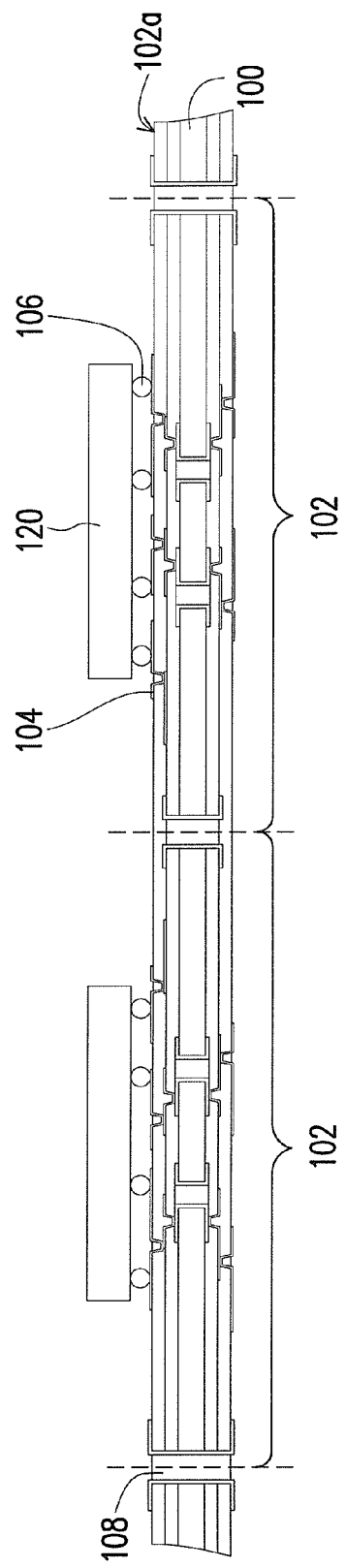
Figure 1C:
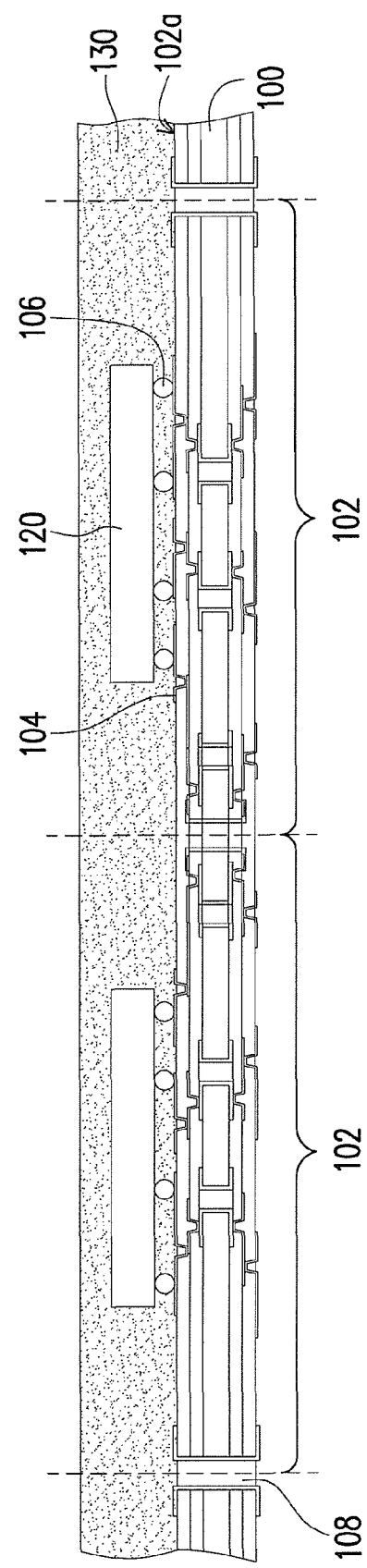
Figure 1D:
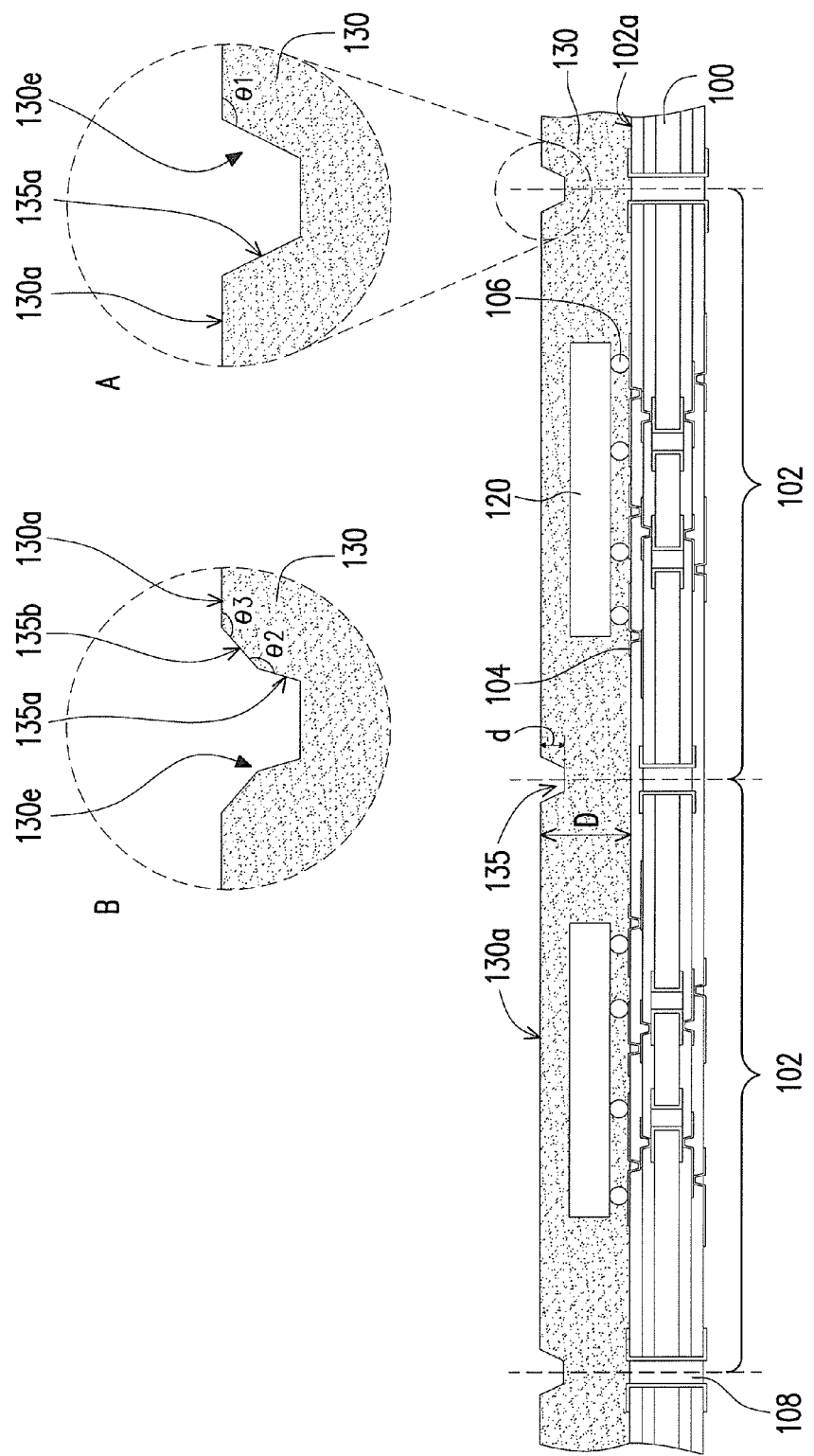
Figure 1D:
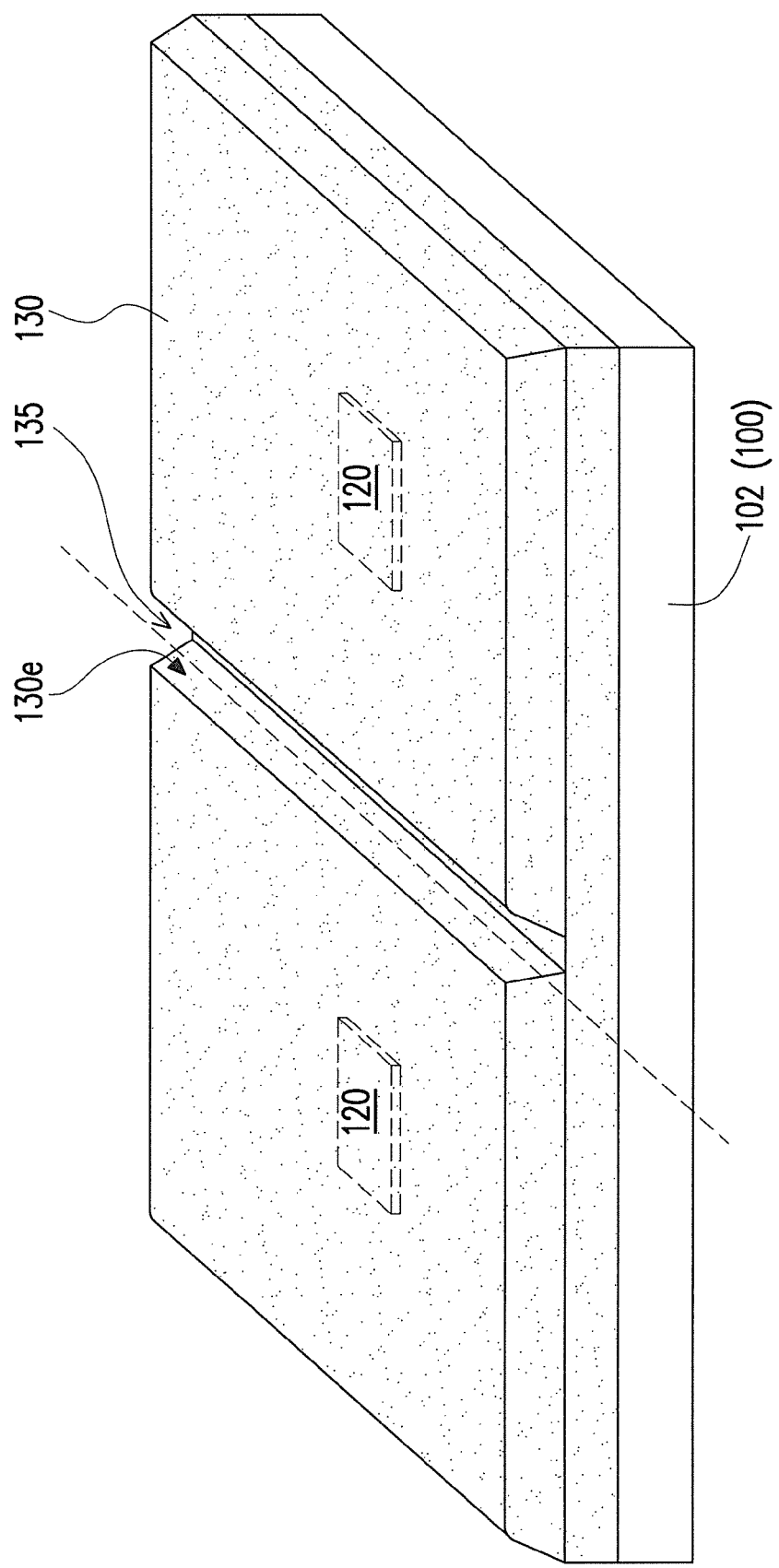

FIGS. 1A through 1G are schematic views showing a manufacturing method of the chip package according to the preferred embodiment of the present invention. FIG. 1D' and 1D" are exemplary three-dimensional schematic views showing the structure of FIG. 1D having grinding trenches of enlarged view A or B.

Referring to FIG. 1A, a matrix substrate 100 having a plurality of substrate 102 (defined by the subsequent sawing lines shown as dotted lines) is provided, while each substrate 102 includes a plurality of contacts 104 thereon and at least a ground via 108 therein. The contacts 104 function as bump pads for flip chip connecting technology. The substrate 100 can be a laminate substrate, for example, a printed circuit board (PCB). Currently achievable designs of the ground via 108 within the substrate 102 are considered encompassed within the present invention. For a laminate substrate, the ground via may extend through the whole substrate (i.e. from the top surface to the bottom surface), or extend from the top or bottom surface to an inner layer thereof, or extend between two inner layers of the substrate. The size of the ground via may be adjusted according to electrical properties of the product, the ground via/plug may be formed from the plated through-hole, or slot hole filled with solder materials. Further, the ground via can be replaced by a ground pad with a conductive solder mass disposed on the upper surface of the substrate.

Referring to FIG. 1B, at least a chip 120 is disposed on the top surface 102a of each substrate 102. Although a chip is provided herein, other surface mount components can be employed, and encompassed within the scope of this invention. The chip 120 is electrically connected to the contacts 104 of the substrate 102 through a plurality of bumps 106 therebetween. Although flip chip connecting technology is described herein, it is well encompassed within the scope of this invention to employ wire bonding technology (i.e. through wire connections). The chip 120 preferably is disposed within a central portion of the substrate 102.

Referring to FIG. 1C, a molding process is carried out to form a molding compound 130 on the matrix substrate 100 to encapsulate the chips 120, the contacts 104, the bumps 106 and at least a portion of the substrate 102. The molding process can be an over-molding process, for example. The material of the molding compound 130 may be epoxy resins or silicon resins, for example.

Referring to FIG. 1D, a grinding process is performed to form a plurality of grinding streaks (grinding trenches) 135 by removing portions of the molding compound 130. The grinding streaks 135 are arranged surrounding the location of the chip 120. Preferably, the grinding streaks 135 within the molding compound 130 are arranged right above the boundary or perimeter of each substrate 102. FIGS. 1D' or 1D" is the 3D schematic view of the structure depicted in FIG. 1D having the grinding trenches of the enlarged view A or B. As shown in FIGS. 1D and 1D', the individual grinding streaks 135 are arranged right on the boundary lines (the dotted lines) of the substrate 102. In this case, the subsequent sawing process will cut through the grinding streaks 135 arranged at the sawing lines (shown as dotted lines). The grinding process may include an oblique disc grinding process, for example. For the oblique disc grinding process, grinding disc with slanted blade cuts into the molding compound to form sloping trenches. Taking the grinding streaks 135 arranged right above the boundary of each substrate 102 as an example, the grinding process may cause a ring-shaped trench within the molding compound 130, along the boundary of each substrate 102.

In details, as shown in FIGS. 1D, 1D' & 1D", the grinding streak 135 is preferably a loop trench having a reverse-hat cross-section (i.e. the trench being narrower at the bottom portion but wider around the top portion). In other words, the grinding process makes the top edges 130e of the molding compound 130 non-orthogonal or non-right-angular. Preferably, the grinding process makes the top edges 130e of the molding compound 130 blunted. The top edges 130e of the molding compound 130 either have one obtuse angle $\theta_1$ (as shown in the enlarged view A), or two obtuse angles $\theta_2$, $\theta_3$ (as shown in the enlarged view B). For example, the obtuse angle $\theta_1$ (between the beveled surface 135a of the grinding streak 135 and the top surface 130a of the molding compound 130) ranges between about 95-165 degrees, while the obtuse angle $\theta_2$ (between the beveled surface 135a and the beveled surface 135b of the grinding streak 135) or the obtuse angle $\theta_3$ (between the beveled surface 135b of the grinding streak 135 and the top surface 130a of the molding compound 130) ranges between about 100-160 degrees, for the grinding streaks 135. Preferably, the grinding depth d ranges approximately from ⅕ to ⅓ of the thickness D of the molding compound 130. In general, the sizes or the depth of the grinding streaks 135 can be altered depending on the shielding requisites or other electrical properties of the package or even varied in accordance with the processing parameters.

Referring to FIG. 1E, an optional half-cutting process is performed to remove portions of the molding compound 130, until the top surface 102a of the substrate 102 is partially exposed. In general, the half-cutting process cuts through the grinding streaks 135 arranged on the sawing lines and cuts through the molding compound 130 into the matrix substrate 100 for a pre-determined depth, to form a plurality of trenches 137. Preferably, the cutting width a of the half-cutting process (i.e. the width a of the trenches 137) is smaller than the width A of the grinding streak 135 (i.e. the grinding width A of the grinding process). In this case, even after the half-cutting process, the blunted edges 130e of the molding compound 130 are retained. The location or arrangement of the ground via can be varied according to product requirements. One exemplary location of the ground via is positioned right on the sawing lines, and the half-cutting process or the singulation process may cut through the ground via. In FIG. 1E, the half-cutting process cuts into the ground via 108 arranged on the sawing lines. Although the half-cutting process is performed after the grinding process according to the present embodiment, it is acceptable to perform the half-cutting process prior to the grinding process. When the half-cutting process is performed prior to the grinding process, the subsequent grinding process can still blunt the top edges of the half-cut molding compound.

Finally, referring to FIG. 1F, a shielding layer 140 is formed over the molding compound 130 to conformally cover the top surface 130a, the sidewalls 130b and the top edges 130e of the molding compound 130. The shielding layer 140 can be formed by depositing a metal material (not shown) to conformally cover the molding compound 130 and the matrix substrate 100 exposed by the trenches 137 using a spray coating method, a plating method, or a sputtering method, for example. The metal material can be, for example, aluminum, copper, chromium, gold, silver, nickel, solder materials, or the combinations thereof.

In principle, the top edges of the molding compound are neither acute-angled nor right-angled, which is prone to poor coating quality (e.g., formation of crevices). Because the top edges 130e of the molding compound 130 according to the present invention are either obtuse or rounded, either the coverage or the conformity of the shielding layer 140 is greatly improved. As much less or no crevices exist in the shielding layer, owing to the uniform coverage of the shielding layer at the corners or edges, the shielding efficacy of the shielding layer is enhanced and the reliability of the package is improved.

Referring to FIG. 1G, from a bottom surface 102b of the matrix substrate 100, a singulation process is performed to cut at the sawing lines and cut through the matrix substrate 100, so as obtain the individual chip packages 10. The singulation process may be a blade sawing process or a laser cutting process, for example.

In accordance with the present invention, the manufacturing methods of the chip package shown in FIGS. 1A through 1G may be further modified and described in the following embodiments. Alternatively, following the process steps of FIGS. 1A-1C, as shown in FIG. 2A, a singulation process is performed to cut through the molding compound 130 and the matrix substrate 100 along the sawing lines, so as obtain the individual chip packages 10. The singulation process also cuts through the ground via 108 within the matrix substrate 100. The singulation process may be a blade sawing process or a laser cutting process, for example. The boundary regions between the top surface 130a and the sidewalls 130b of the molding compound 130 are denoted as the top edges 130e of the molding compound 130 herein. As shown in FIG. 2A, the top edges 130e of the molding compound 130 are substantially right-angled after singulation.

Figure 2B:
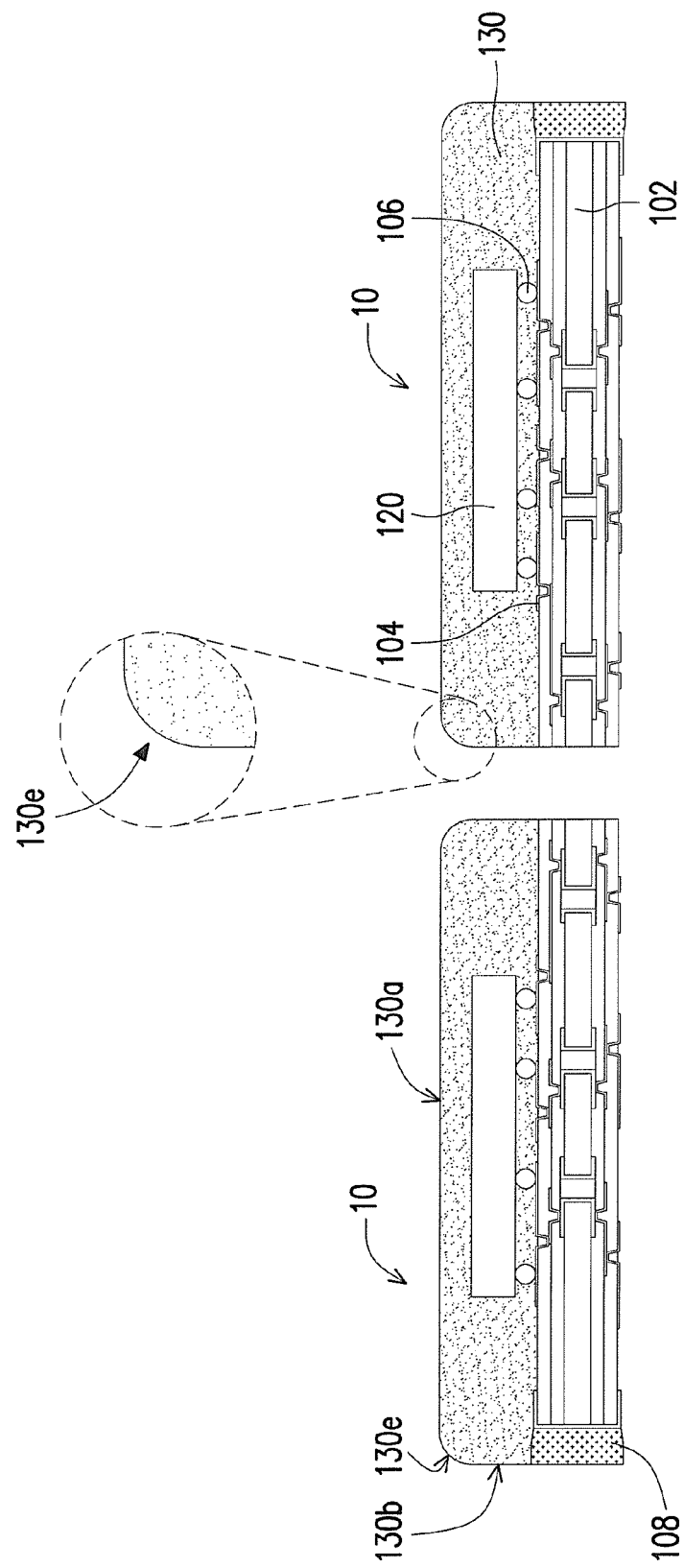
FIGS. 2A though 2C are schematic views showing certain steps of the manufacturing method of the chip package according to another preferred embodiment of the present invention.

Later, referring to FIG. 2B, a grinding process is performed to blunt the top edges 130e of the molding compound 130 of the singulated packages 10. As the singulation process cuts through the sawing lines, the grinding process is performed toward the top edges 130*e* of the molding compound 130 right above the boundary or perimeter of each substrate 102. As described herein, the top edges 130*e* are substantially right-angled before grinding, and the grinding process turns the top edges 130*e* of the molding compound 130 to blunt or rounded top edges 130*e*. The grinding process may include an oblique disc grinding process or a rounding grinding process, for example. As shown in FIG. 2B, the top edges 130*e* of the molding compound 130 become rounded after the grinding process. However, according to the embodiments of this invention, the top edges 130*e* of the molding compound 130 can be either blunted (i.e. having at least one obtuse angle as shown in the enlarged views A-B of FIG. 1D), or rounded (i.e. having curved profiles as shown in the enlarged view at the top of FIG. 2B). Also, the angle or curvature of the blunted or rounded top edges can be varied according to the processing parameters.

Figure 2C:
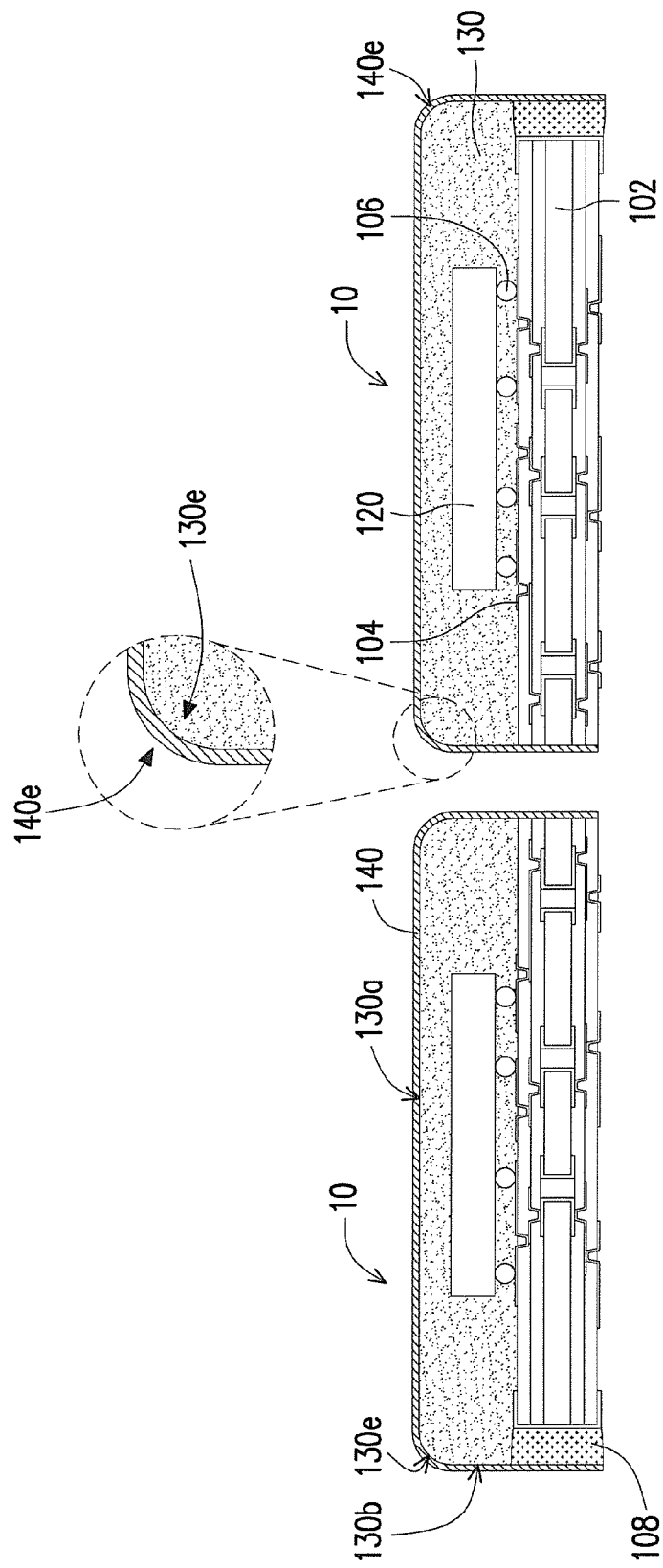

Following FIG. 2B, as shown in FIG. 2C, a shielding layer 140 is conformally formed over the molding compound 130 to cover the top surface 130*a*, the sidewalls 130*b* and the rounded top edges 130*e* of the molding compound 130. The shielding layer 140 can be formed by depositing a metal material (not shown) to cover the molding compound 130 and sidewalls of the singulated substrate 102 using a spray coating method, a plating method, or a sputtering method, for example.

In other words, since the shielding layer 140 conformally covers the obtuse or rounded top edges 130*e* of the molding compound 130, as shown in the enlarged partial view at the top of FIG. 2C, the resultant shielding layer 140 also has obtuse or rounded top edges 140*e* (i.e. smooth profiles right above the top edges 130*e* of the molding compound 130).

Figure 3:
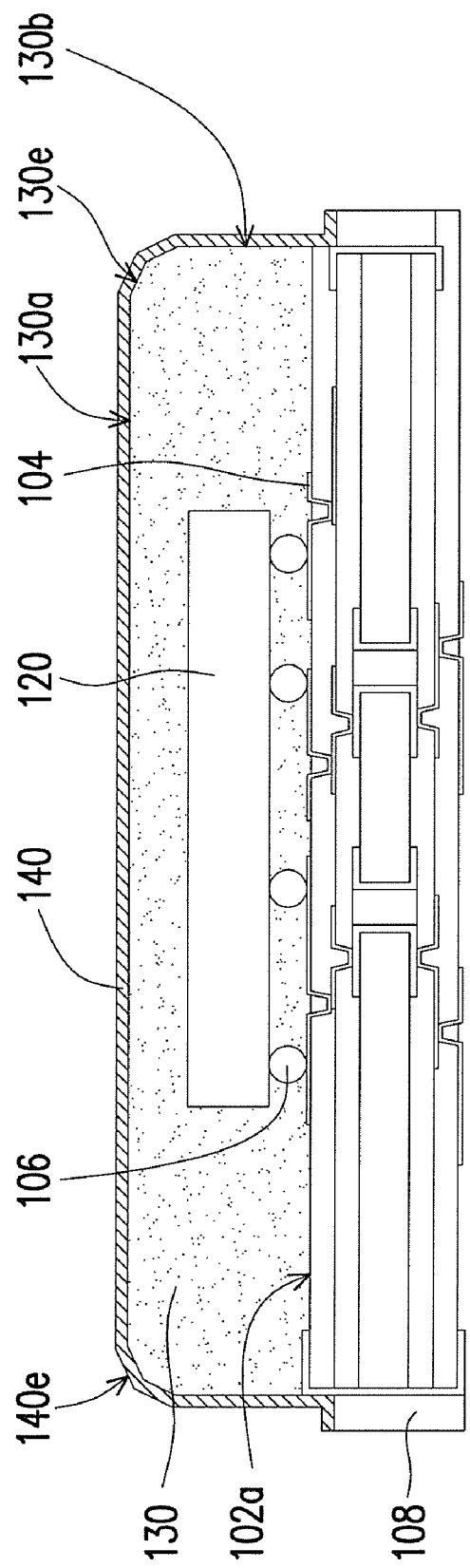
FIG. 3 is a cross-sectional view of a chip package according to an embodiment of the present invention.

FIG. 3 is a cross-sectional view of a chip package according to a preferred embodiment of the present invention. Referring to FIG. 3, the chip package 30 of the present embodiment includes a substrate 102, a plurality of contacts 104, a plurality of bumps 106, at least a chip 120, a molding compound 130 and a shielding layer 140. The substrate 102 can be a laminated substrate, for example, a two-layered or a four-layered laminated PCB substrate. The chip 120 can be a semiconductor chip, for example, a radio-frequency (RF) chip. The material of the shielding layer 140 may be copper, chromium, gold, silver, nickel, aluminum or alloys thereof or even a solder material, for example. The chip 120 is electrically connected to the substrate 102 through the contacts (bump pads) 104 and the bumps 106. The molding compound 130 encapsulates portions of the substrates 102, the bumps 106, and the chip 120. As shown in FIG. 3, the shielding layer 140 is disposed over the molding compound 130, covering the top surface 130*a*, the sidewalls 130*b* and the blunted top edges 130*e* of the molding compound 130. The boundary regions between the top surface 130*a* and the sidewalls 130*b* of the molding compound 130 are denoted as the top edges 130*e* of the molding compound 130 herein, and the detailed profile of the blunted top edges 130*e* of the molding compound 130 is similar to the enlarged view B of FIG. 1D. As the half-cutting process cut through the molding compound 130 along the sawing lines before the formation of the shielding layer 140, the molding compound 130 are fully covered by the shielding layer and will not be exposed from the chip package 30. The shielding layer 140 is electrically connected to the substrate 102 through the direct contact with at least a ground vias 108 of the substrate 102, and the shielding layer 140 is electrically grounded through the ground via 108. Hence, taking advantage of the metal traces or vias of the substrate, the shielding layer of the present invention can be grounded within the package structure using the ground plane of the substrate. The shielding layer can establish an electrical ground path within the package structure, devoid of using an extra ground plane.

Figure 4:
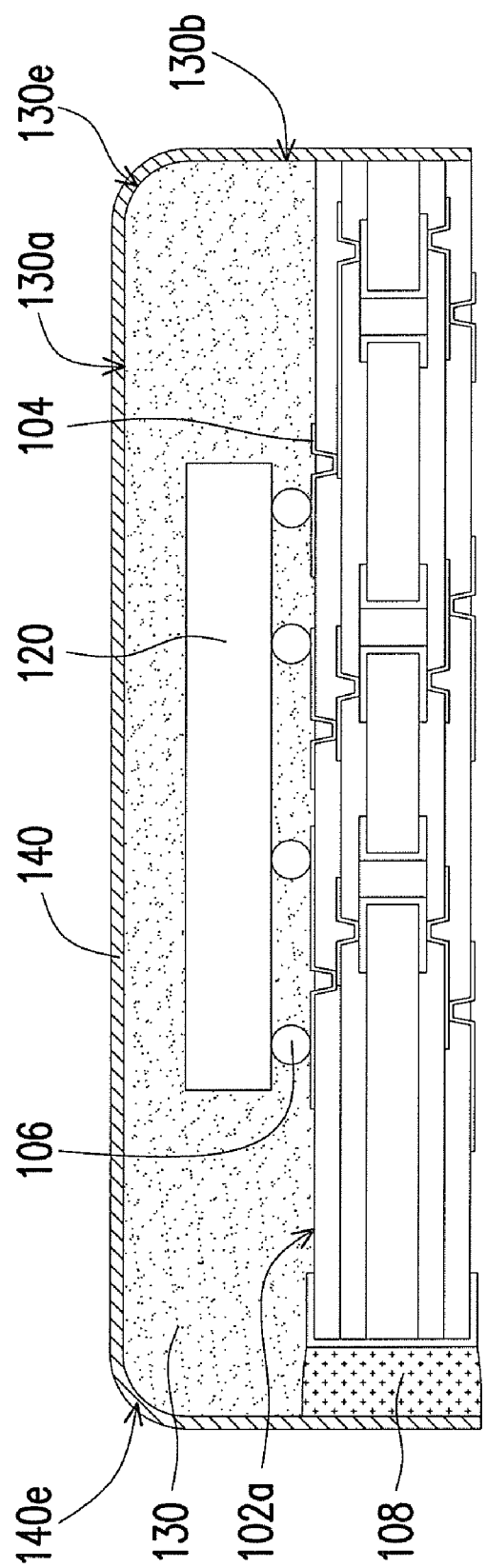
FIG. 4 is a cross-sectional view of a chip package according to another embodiment of the present invention.

FIG. 4 is a cross-sectional view of a chip package according to another preferred embodiment of the present invention. Referring to FIG. 4, the chip package 40 is mostly similar to the package structure of FIG. 3, except the rounded top edges 130*e* of the molding compound 130. The detailed profile of the rounded top edges 130*e* of the molding compound 130 is similar to the enlarged view of FIG. 2B. As the singulation process cut through the molding compound 130 and the matrix substrate along the sawing lines before the formation of the shielding layer 140, the sidewalls of the substrate 102 and the molding compound 130 are fully covered by the shielding layer and will not be exposed from the chip package 40. The shielding layer 140 is electrically connected to the substrate 102 through the direct contact with at least a ground plug/solder-filled slot hole 108 of the substrate 102, and the shielding layer 140 is electrically grounded through the ground plug/solder-filled slot hole 108.

Figure 5:
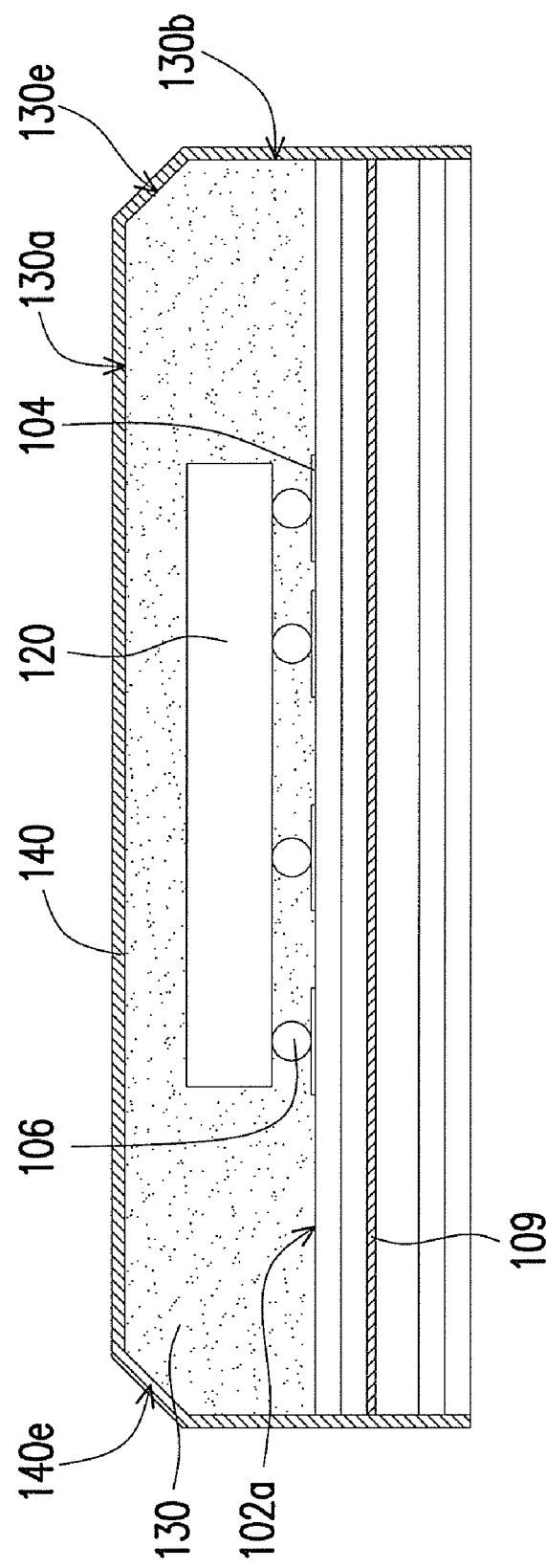
FIG. 5 is a cross-sectional view of a chip package according to another embodiment of the present invention.

FIG. 5 is a cross-sectional view of a chip package according to another preferred embodiment of the present invention. Referring to FIG. 5, the chip package 50 is mostly similar to the package structure of FIG. 4. However, the detailed profile of the rounded top edges 130*e* of the molding compound 130 is similar to the enlarged view A of FIG. 1D. The sidewalls of the substrate 102 and the molding compound 130 are fully covered by the shielding layer and will not be exposed from the chip package 50. The shielding layer 140 is electrically connected to the substrate 102 through the direct contact with at least a ground plane 109 of the substrate 102, and is electrically grounded through the ground plane 109.

In brief, due to the rounding or blunting effect of the grinding process, the top edges and top corners of the molding compound become blunted (having an obtuse angle) or rounded, and the subsequently formed shielding layer can satisfactorily covers the molding compound without crevice. In the chip package structures of the present embodiment, the shielding layer disposed over the molding compound and the substrate function as an EMI shield, protecting the package from the EMI radiation from the surrounding radiation sources. In this case, the uniform coverage of the shielding layer over the molding compound, especially around the top edges and the corners, can effectively enhance the EMI shielding efficacy of the packages. In addition, the reliability of the package can be improved. As the top edges and top corners of the package structures become blunted or rounded, the leakage occurring at the corners can also be alleviated, thus boosting the electrical performances of the package structures. Accordingly, such design is compatible with the packaging of high frequency devices, particularly, radio frequency devices.

Although the present invention has been disclosed above by the embodiments, they are not intended to limit the present invention. Anyone skilled in the art can make some modifications and alteration without departing from the spirit and scope of the present invention. Therefore, the protecting range of the present invention falls in the appended claims.

What is claimed is:

1. A semiconductor package, comprising:
    a substrate;
    a molding compound disposed adjacent to the substrate and including an upper surface, a sidewall, and a connecting section that extends from the upper surface to the sidewall, the connecting section including a first planar surface and a second planar surface that incline away from the upper surface; and a shielding layer disposed adjacent to the molding compound, wherein the shielding layer conformally covers the upper surface, the sidewall, and the connecting section of the molding compound, and the shielding layer is electrically connected to the substrate, wherein the first planar surface and the second planar surface define an obtuse angle in the range from 100 degrees to 160 degrees that faces inwardly toward the molding compound.

2. The semiconductor package as claimed in claim 1, wherein the second planar surface and the sidewall define an obtuse angle.

3. The semiconductor package as claimed in claim 1, wherein the upper surface and the first planar surface define an obtuse angle in the range from 95 degrees to 165 degrees.

4. The semiconductor package as claimed in claim 1, wherein the first planar surface and the second planar surface define a contiguous arc.

5. The semiconductor package as claimed in claim 1, wherein:
the shielding layer at least partially covers a lateral surface of the substrate.

6. A semiconductor package, comprising:
a substrate;
a molding compound disposed adjacent to the substrate and including an upper surface, a sidewall, and a connecting section that extends from the upper surface to the sidewall, the connecting section including a first surface that inclines away from the upper surface; and
a shielding layer disposed adjacent to the molding compound, wherein the shielding layer conformally covers the upper surface, the sidewall, and the connecting section of the molding compound, and the shielding layer is electrically connected to the substrate,
wherein
the first surface is planar;
the connecting section includes a second surface that is planar and that extends from the first surface; and
the second surface is not orthogonal to the first surface, wherein the first surface and the second surface define an obtuse angle in the range from 100 degrees to 160 degrees that faces inwardly toward the molding compound.

7. The semiconductor package as claimed in claim 6, wherein:
the first surface is a first beveled surface, and the second surface is a second beveled surface that is contiguous with the first beveled surface.

8. The semiconductor package as claimed in claim 6, wherein the substrate includes a ground via, wherein the shielding layer physically contacts a side surface of the ground via.

9. The semiconductor package as claimed in claim 8, wherein the shielding layer fully covers the side surface of the ground via.

10. A semiconductor package, comprising:
a substrate;
a package body including a lateral surface, an upper surface, and an edge portion circumscribing the upper surface, wherein the lateral surface is substantially perpendicular to the upper surface, and wherein the first edge portion includes a first beveled surface and a second beveled surface, each of which slopes downwardly and outwardly from the upper surface toward the lateral surface, and wherein the first beveled surface and the second beveled surface define an obtuse angle in the range from 100 degrees to 160 degrees that faces inwardly toward the package body; and
a shield covering the package body, wherein the shield physically contacts at least the upper surface and the edge portion.

11. The semiconductor package as claimed in claim 10, wherein:
the second beveled surface and the lateral surface define an obtuse angle.

12. The semiconductor package as claimed in claim 10, wherein:
the upper surface and the first beveled surface define an obtuse angle in the range from 95 degrees to 165 degrees.

13. The semiconductor package as claimed in claim 10, wherein the first beveled surface is contiguous with the second beveled surface.

14. The semiconductor package as claimed in claim 1, wherein the shield at least partially covers a lateral surface of the substrate, and the lateral surface of the substrate is substantially co-planar with the lateral surface of the package body.

15. A semiconductor package, comprising:
a substrate;
a chip disposed on and electrically connected to the substrate; and
a shield disposed over the chip, wherein the shield includes an upper surface, a lateral periphery circumscribing the upper surface, and a connecting section extending from the upper surface to the lateral periphery, wherein:
the connecting section includes a first portion extending from the upper surface, wherein the first portion and the upper surface define a first obtuse angle, and a second portion extending from the first portion to the lateral periphery, wherein the first portion and the second portion define a second obtuse angle that faces inwardly toward the chip.

16. The semiconductor package as claimed in claim 15, wherein the connecting section defines a contiguous arc.

17. The semiconductor package as claimed in claim 15, wherein the first obtuse angle faces inwardly toward the chip.

18. The semiconductor package as claimed in claim 15, wherein the second portion is substantially planar.

19. The semiconductor package as claimed in claim 15, wherein a junction of the first portion and the second portion defines an apex.

20. The semiconductor package as claimed in claim 15, wherein the second obtuse angle is less than the first obtuse angle.

* * * * *